(12) United States Patent
Inada (10) Patent No.: US 6,313,916 B1
(45) Date of Patent: Nov. 6, 2001

(54) POSITION DETECTING SYSTEM AND PROJECTION EXPOSURE APPARATUS WITH THE SAME

(75) Inventor: Hiroshi Inada, Utsunomiya (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 09/179,594

(22) Filed: Oct. 27, 1998

(30) Foreign Application Priority Data

Oct. 28, 1997 (JP) .................................................. 09-311221

(51) Int. Cl.$^7$ .................................................. G01B 11/00
(52) U.S. Cl. ........................ 356/399; 356/401; 356/508
(58) Field of Search .................................. 356/401, 363, 356/399, 400, 349, 356; 250/548

(56) References Cited

U.S. PATENT DOCUMENTS 5,489,986 * 2/1996 Magome et al. ...................... 356/401

FOREIGN PATENT DOCUMENTS

| 5-313219 | 11/1993 | (JP) . |
| 05-343291 | * 12/1993 | (JP) . |
| 5-343291 | 12/1993 | (JP) . |

\* cited by examiner

Primary Examiner—Frank G. Font
Assistant Examiner—Roy M. Punnoose
(74) Attorney, Agent, or Firm—Fitzpatrick, Cella, Harper & Scinto (57) ABSTRACT

A position detecting system to be used with a grating mark provided on an object and having different directionalities is disclosed, wherein light is projected to the grating mark, and wherein light from the grating mark is detected through a beam splitter disposed at or adjacent a pupil of a detection optical system, for receiving light from the grating mark, the beam splitter having a reflective coating partially formed thereon.

54 Claims, 6 Drawing Sheets

POSITION DETECTING SYSTEM AND PROJECTION EXPOSURE APPARATUS WITH THE SAME

FIELD OF THE INVENTION AND RELATED ART

This invention relates generally to a projection exposure apparatus having high alignment function and, more particularly, to a position detecting system and a projection exposure apparatus with the same, wherein position detection is performed by use of an interference image of diffractive light produced by a grating mark, having a periodicity and being provided on an object such as a wafer to be detected.

Semiconductor device manufacturing technology has been advanced remarkably, and microfabrication techniques have also been improved considerably. Particularly, optical processing techniques have entered a microfabrication region of submicron resolution order, after production of 1 MDRAM semiconductor chips.

With increases in density of a semiconductor chip along with miniaturization of IC or LSI, the range of tolerance for registration between a mask pattern and a wafer (photosensitive substrate) becomes very narrow. Usually, positional information of a wafer is obtained by use of alignment marks provided on the wafer. There are various methods for observation of such alignment marks.

Most prevalent method is one based on use of video image. Japanese Laid-Open Patent Application, Laid-Open No. 343291/1993 shows a method which is based on an interference image obtainable by extracting (±n)-th order light (n=1, 2, 3, . . . ) among reflectively diffractive light as produced by a grating mark having periodicity and being provided on a wafer surface. Such interference image is then FFT processed and the phase is detected. The detection resolution is therefore high, and the system is incorporated into a projection exposure apparatus as an alignment microscope.

Figure 1:
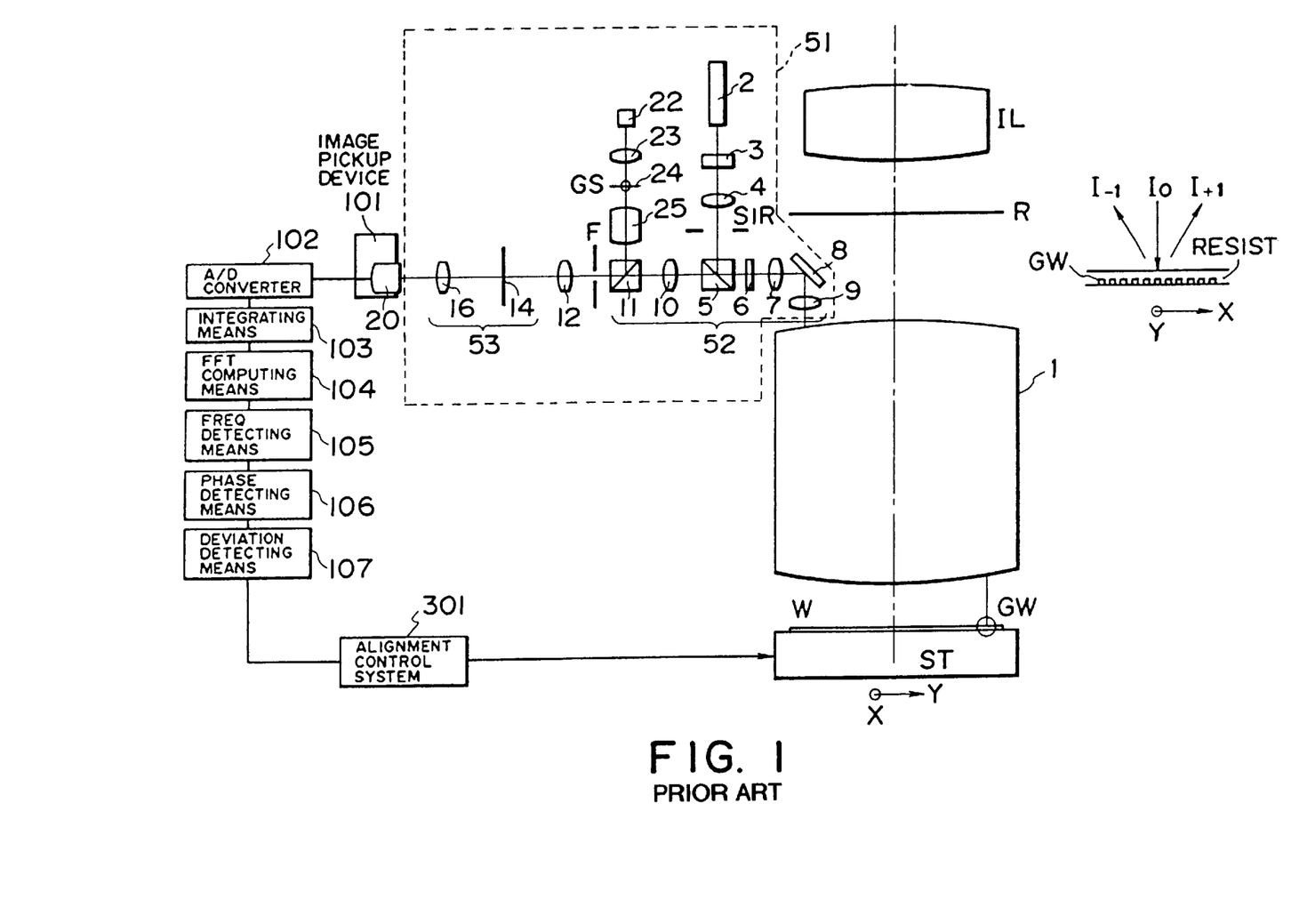
FIG. 1 is a schematic view of a projection exposure apparatus of known type that uses a grating mark.

FIG. 1 shows a schematic arrangement of the 15 system of the aforementioned Japanese Laid-Open Patent Application, Laid-Open No. 343291/1993. Lithographic transfer of a pattern is performed by projecting, through a projection lens 1 and in a reduced scale, an electronic circuit pattern formed on a reticle R surface as illuminated by exposure light from an illumination system IL, onto a wafer W surface placed on a wafer stage ST.

In an alignment operation, an interference image is formed by (+−n)-th order light (n=1, 2, 3, . . . ) produced by a grating mark with periodicity, as provided on the wafer surface. The interference image detected is FFT processed, whereby a phase thereof is detected, such that it is transformed into positional information. Here, components of the alignment system have the following functions.

Denoted at 51 is a detection optical system having a reference mark GS. Denoted at 101 is an image pickup means having a solid image pickup device. Denoted at GW is a wafer mark (grating mark or alignment mark) which is provided on the wafer surface.

For the alignment operation, within the projection exposure apparatus, the relative position of the reticle R relative to the projection lens 1, the detection optical system 51 and the image pickup means 101 is predetected by using an appropriate detection system. In this state, the position of a projected image of the wafer mark GW of the wafer W with respect to a projected image of the reference mark GS within the detection optical system 51, is detected upon an image pickup surface of the image pickup device 101. Thus, relative alignment of the reticle R and the wafer W is performed indirectly.

In conventional projection exposure apparatuses, the position of the wafer mark GW will be detected in the manner to be described below, for positioning the wafer W with respect to a predetermined position.

Denoted at 2 is a HeNe laser which produces rectilinearly polarized light of alignment wavelength $\lambda$ different from the exposure light (to be used for the exposure process). The light from the laser 2 enters an acoustooptic optical element (AO element) 3, by which the quantity of light directed to a lens 4 is controlled. The acoustooptic element 3 has a function of blocking light completely when it is in a certain state. The light passing through the acoustooptic element 3 is collected by the lens 4 and, after this, it impinges on a polarization beam splitter 5 while the illumination range is spatially restricted by means of a field stop SIR which is disposed on a plane I optically conjugate with the wafer W.

The polarization beam splitter 5 reflects the received light, and the reflected light goes via a quarter waveplate 6, a lens 7, a mirror 8, a lens 9 and the projection lens 1. The light then illuminates the wafer mark GW on the wafer W surface, perpendicularly.

Figure 2:
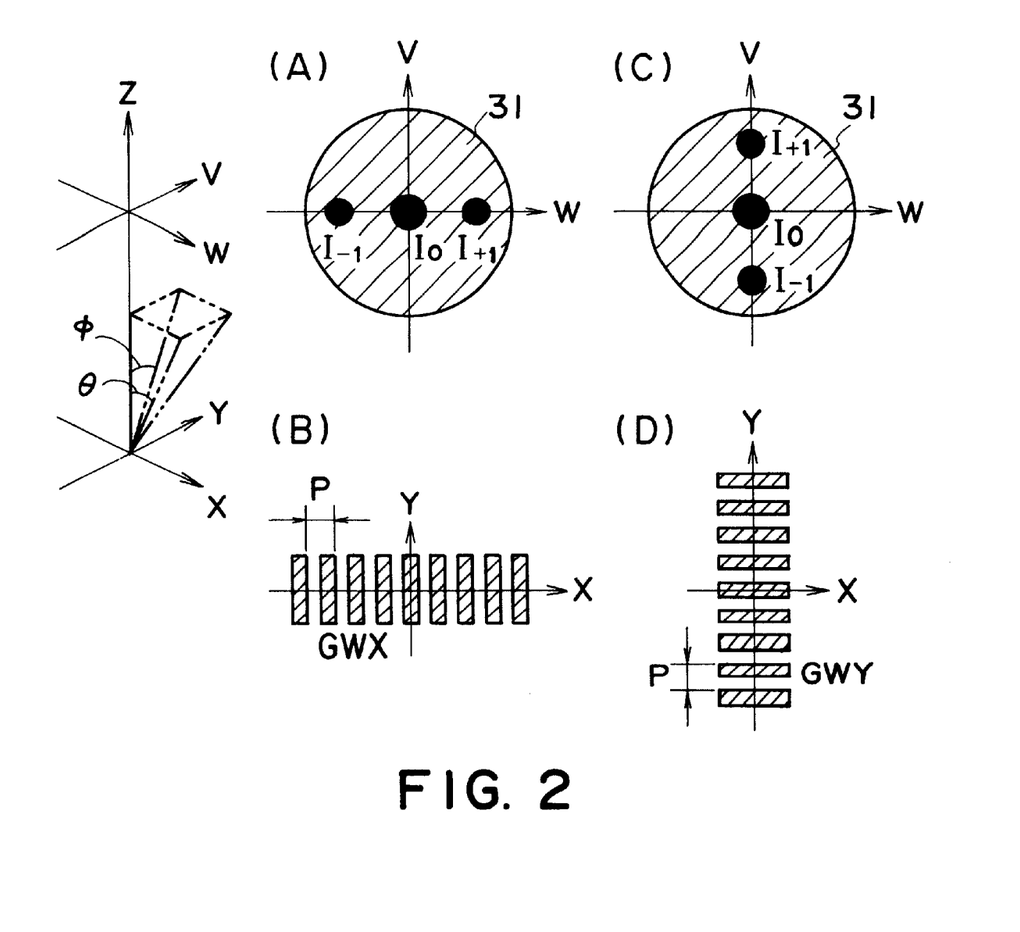
FIG. 2 is a schematic view for explaining light quantity distribution of grating mark upon a pupil plane of a projection exposure apparatus.

Here, the illumination light passes the portion $I_0$ (FIG. 2, (A) and (C)) upon the pupil plane 31 of the optical system which is constituted by the projection lens 1, the lens 9 and the lens 7. In FIG. 2, V and W denote coordinates on the pupil plane 31, and the portion $I_0$ represents incidence angle distribution of the illumination light with respect to the wafer W surface. The pupil plane 31 corresponds to the Fourier's transformation surface for the wafer W surface which is an image plane, and therefore the illumination light impinges on the wafer W surface substantially perpendicularly.

As shown in FIG. 2, (B) and D), the wafer mark GW formed on the wafer W surface comprises a diffraction grating pattern (grating mark) of a pitch P. The portions with hatching in (B) and (D) of FIG. 2 denoted that theses regions have a difference in level (height) as compared with other regions on the wafer surface, or they have a difference in phase, thus providing the function as a diffraction grating.

The light reflected by the wafer mark GW passes through the projection lens 1 and, thereafter, it goes via the lens 9, mirror 8, lens 7, quarter waveplate 6 and polarization beam splitter 5, in this order. Then, it goes via the lens 10 and the beam splitter 11, and it forms an aerial image of the wafer mark GW, at position F. The aerial image of the wafer mark GW formed at the position F passes through a Fourier transformation lens 12 whereby it is Fourier transformed. Stopper 14 serves to selectively transmit only light of predetermined orders, out of the reflectively diffractive light from the wafer mark GW.

If, for example, reflectively diffractive light of n-th order is to be transmitted, what to be selected is reflectively diffractive light corresponding to $\pm\sin^{-1}(n\lambda/P)$. The light selected by the stopper 14 goes through a Fourier transformation lens 16, and it forms an interference image of the wafer mark GW upon a solid image pickup device 20. The produced interference image is an image of the wafer mark GW that provides a diffraction grating of pitch P as illuminated by monochromatic light. Therefore, it has sufficiently high and stable signal light quantity and contrast as compared with a dark field image in a case where scattered light is used.

In the optical arrangement described above, the lenses 7 and 10 provide a correction optical system 52 in respect to the imaging of the wafer mark GW, which serves to correct aberrations such as on-axis chromatic aberration or spherical aberration, for example, to be produced by the projection lens 1 with respect to the alignment wavelength. It is not necessary for the correction optical system 52 to perform aberration correction with respect to all the light beams to be received. Aberration correction should be made only with respect to the reflectively diffractive light passed through the stopper 14. Thus, the system 52 can be accomplished with a simple structure. In excimer steppers that use light of an excimer laser as exposure light, the amount of aberration produced with respect to the alignment wavelength which illuminates the wafer mark GW is large as compared with that in projection exposure apparatus using conventional g-line or i-line light. The restricted necessity of aberration correction described above is therefore very effective.

Figure 3A:
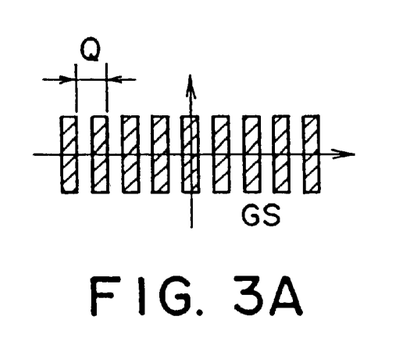
FIGS. 3A and 3B are schematic views, respectively, for explaining a reference mark.

On the other hand, a light source 22 such as LED, for example, produces light of a wavelength different from the alignment illumination wavelength for the wafer mark GW, and the light from the light source 22 is collected by a condenser lens 23 to illuminate a reference mark GS which is formed on the surface of a reference mask 24. The reference mark GS provides a detection reference for the detection optical system 51. As shown in FIG. 3A, it comprises, for example, a grating mark similar to the wafer mark GW. In FIG. 3A, those portions depicted with hatching correspond transparent regions, and the remaining portions correspond to non-transparent regions.

The light passed through the reference mark GS is collected by a lens 25. Then, by means of the beam splitter 11 which serves to reflect light from the LED 22 and to transmit light from the HeNe laser 2, an aerial image of the reference mark GS is formed on the plane F.

Similarly to the wafer mark GW, the aerial image of the reference mark GS upon the plane F is imaged upon the solid image pickup device 20 through the Fourier transformation lenses 12 and 16. Here, the optical system provided by the Fourier transformation lenses 12 and 16 are satisfactorily aberration corrected with respect to two wavelengths for illuminating the reference mark GS and the wafer mark GW.

Figure 4A:
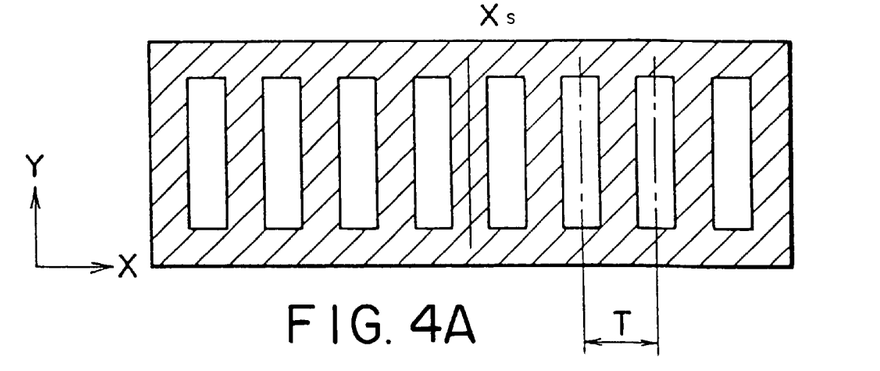
FIGS. 4A and 4B are schematic views for explaining detection of an interference image of a grating mark, upon an image pickup surface.
Figure 4B:
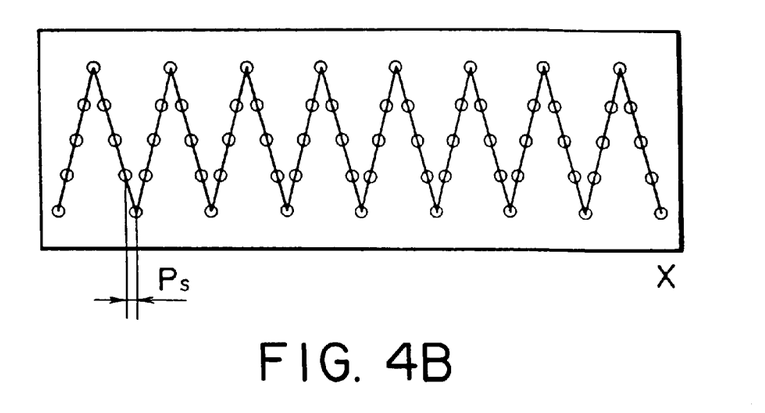

With respect to the intensity distribution of reflection light from the wafer mark GW upon the pupil plane as formed by the illumination light projected on the wafer W surface, the stopper 14 functions as a pupil plane filter. As a result of this, the light impinging on the solid image pickup device 20 consists only of diffractive light of ($\pm n$)-th order (n=1, 2, 3, ...) from the wafer mark GW. If the stopper 14 transmits only ($\pm n$)-th order diffractive light, the interference image M of the wafer mark GW (FIG. 4A) is formed upon the solid image pickup device 20 in the manner as illustrated in FIG. 4B. The intensity distribution of the interference image M is, if $\beta$ is the imaging magnification, a cosine function having a period T wherein T=$\beta \cdot P/2$, and it has an intensity distribution of a phase corresponding to a positional deviation of the wafer mark GW on the wafer W from the optical axis.

If only ($\pm n$)-th order diffractive light (n=1, 2, 3, ...) is transmitted through the stopper 14, the coordinate position of the transmitting portion of the pupil plane filter is the position corresponding to an angle $\pm \sin^{-1}(n\lambda/P)$ with respect to the wafer W surface. Thus, what is imaged upon the solid image pickup device 20 is a cosine function of the period T=$\beta \cdot P/(2n)$.

The image of the reference mark GS and the image of the wafer mark GW as imaged upon the solid image pickup device 20 can have the same pitch T, if the pitch Q of the reference mark GS and the pitch P of the wafer mark GW are determined in accordance with the imaging magnifications of the respective optical systems. If the same pitch is accomplished, then, in the phase difference detection based on FFT processing (Japanese Laid-Open Patent Application, Laid-Open No. 343291/1993), analysis can be made constantly at a fixed frequency.

Figure 5:
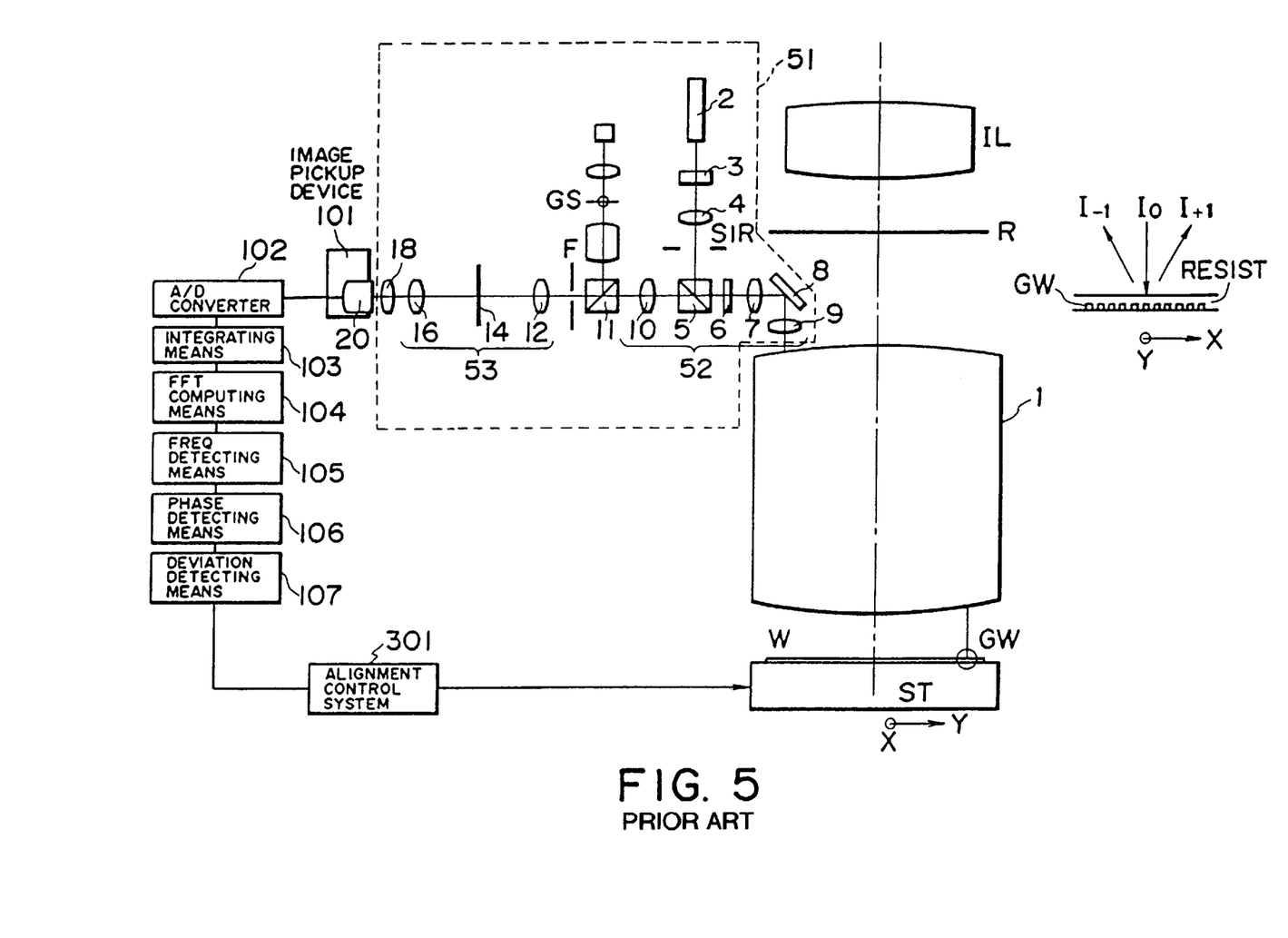
FIG. 5 is a schematic view of a projection exposure apparatus of known type that uses a grating mark and a line sensor.

On the other hand, for enhanced detection resolution, an alignment detection system with increased imaging magnification has been proposed, as shown in FIG. 5. In this example, the system is provided with a line sensor 20 as image pickup means having a wide detection range, and a cylindrical optical system 18 for performing optical integration for suppressing a decrease in light quantity due to enlargement of the magnification.

However, in a system where an interference image of reflectively diffractive light of (+−n)-th order (n=1, 2, 3, ...) produced from a periodic grating mark formed on a wafer is FFT processed to perform phase detection, if, for enhancement of detection resolution, the imaging magnification is enlarged and a line sensor 20 which is an image pickup means having a wide detection range is used, the following problems arise. That is, while the detection optical system 51 wherein the magnification is enlarged needs use of a cylindrical optical system 18 for optical integration for suppressing a decrease of light quantity due to enlargement of magnification, the line sensor 20 can perform measurement only with respect to one measurement direction, i.e., its lengthwise direction. Therefore, for position measurement with respect to orthogonal directions (X and Y), it is necessary to provide on the wafer surface two grating marks GWX and GWY at (B) and (D) in FIG. 2 for X and Y measurements. Additionally, the detection optical system must be provided with two detection systems.

Conventionally, two detection optical systems 51 for measurement of X and Y grating marks should be provided independently, for X and Y measurements. Alternatively, two detecting optical systems should be provided, wherein one detection system is used in combination with a switching mirror or a half mirror for separating the light path of an observation microscope into X measurement path and Y measurement path, for measurement of X and Y grating marks, respectively.

However, if two detection optical systems are to be incorporated into a projection exposure apparatus, it takes a large space within the apparatus. If a switching mirror is used to split the light path for X and Y, within one detection optical system, vibration due to switching drive of the mirror or heat generation caused by an actuator, for example, makes it very difficult to attain high measurement precision. When a half mirror is used to split the light path into X and Y within one detection optical system, the light-quantity decreases to a half.

SUMMARY OF THE INVENTION

It is accordingly an object of the present invention to provide a position detecting system and/or a position detecting method by which a decrease of light quantity or of measurement precision can be prevented.

It is another object of the present invention to provide a position detecting system and/or a position detecting method which does not need a large space.

It is a further object of the present invention to provide a position detecting system and/or a position detecting method by which precise detection is attainable for a grating mark on a wafer with use of a line sensor.

It is a yet further object of the present invention to provide a projection exposure method and/or apparatus by which a reticle pattern can be projected and printed on a wafer accurately.

In accordance with an aspect of the present invention, there is provided a position detecting system to be used with a grating mark provided on an object and having different directionalities, comprising: means for projecting light to the grating mark; and a detection optical system for detecting light from the grating mark, said detection optical system including a beam splitter disposed at or adjacent a pupil of said detection optical system and having a reflective coating partially formed thereon.

In one preferred form of this aspect of the present invention, the grating mark may comprise one of (i) a dot-like mark having periodicity in two directions and (ii) two marks having periodicity in different directions.

In one preferred form of this aspect of the present invention, said reflective coating of said beam splitter may have a function for selectively reflecting one component of reflectively diffractive light from the grating mark and for selectively transmitting the other component of the reflectively diffractive light from the grating mark.

In one preferred form of this aspect of the present invention, said detection optical system may further include means for correcting aberration of reflectively diffractive light of a predetermined order, with respect to light reflected by or transmitted through said beam splitter.

In one preferred form of this aspect of the present invention, said detection optical system may further include a stopper for transmitting reflectively diffractive light of said predetermined order.

In one preferred form of this aspect of the present invention, said detection optical system may further include means for applying an integration effect, with respect to a non-measurement direction of the grating mark, to light transmitted through said beam splitter.

In one preferred form of this aspect of the present invention, said detection optical system may provide the integration effect with use of a cylindrical lens, and said detection optical system may further include a one-dimensional sensor for detecting light passed through the cylindrical lens.

In one preferred form of this aspect of the present invention, said detection optical system may further include a reference mark projecting optical system disposed between the object and said beam splitter, for providing a reference for detection by said detection optical system.

In accordance with another aspect of the present invention, there is provided a position detecting method to be used with a grating mark provided on an object and having different directionalities, comprising the steps of: projecting light to the grating mark; and detecting light from the grating mark through a beam splitter disposed at or adjacent a pupil of a detection optical system, for receiving light from the grating mark, the beam splitter having a reflective coating partially formed thereon.

In one preferred form of this aspect of the present invention, the grating mark may comprise one of (i) a dot-like mark having periodicity in two directions and (ii) two marks having periodicity in different directions.

In one preferred form of this aspect of the present invention, the reflective coating of the beam splitter may have a function for selectively reflecting one component of reflectively diffractive light from the grating mark and for selectively transmitting the other component of the reflectively diffractive light from the grating mark.

In one preferred form of this aspect of the present invention, the detection optical system may have a function for correcting aberration of reflectively diffractive light of a predetermined order, with respect to light reflected by or transmitted through the beam splitter.

In one preferred form of this aspect of the present invention, the detection optical system may include a stopper for transmitting reflectively diffractive light of said predetermined order.

In one preferred form of this aspect of the present invention, the detection optical system may have a function for applying an integration effect, with respect to a non-measurement direction of the grating mark, to light transmitted through the beam splitter.

In one preferred form of this aspect of the present invention, the detection optical system may provide the integration effect with use of a cylindrical lens, and the detection optical system may have a function for detecting light passed through the cylindrical lens by use of a one-dimensional sensor.

In one preferred form of this aspect of the present invention, the detection optical system may further include a reference mark projecting optical system disposed between the object and the beam splitter, for providing a reference for detection by the detection optical system.

In accordance with a further aspect of the present invention, there is provided a method of detecting a position of an object, comprising the steps of: taking an interference image of a dot-like mark provided on the object and having periodicity in two directions; and detecting the position of the object on the basis of the image taking.

In one preferred form of this aspect of the present invention, in said image taking step, interference images having directionalities in two directions, respectively, may be produced from the mark.

In one preferred form of this aspect of the present invention, the interference images having directionalities in two directions may be taken by use of different elements, for detection of the position.

In accordance with a yet further aspect of the present invention, there is provided a method of detecting a position of an object, comprising the steps of: taking an interference image of a dot-like mark having periodicity in two directions and being provided on a detection optical system for receiving light from a mark on the object, the interference image being taken as a detection reference for the detection optical system; and detecting the position of the object on the basis of the detection reference.

In one preferred form of this aspect of the present invention, in said image taking step, interference images having directionalities in two directions, respectively, may be produced from the mark of the detection optical system.

In one preferred form of this aspect of the present invention, in said image taking step, interference images having directionalities in two directions, respectively, and produced from the mark of the detection optical system, may be taken by use of different elements, for position detection.

In accordance with a still further aspect of the present invention, there is provided a projection exposure apparatus for performing position detection with use of a grating mark provided on a substrate and having different directionalities, and for projecting and printing a circuit pattern of an original onto the substrate, said apparatus comprising: means for projecting light to the grating mark; and a detection optical system for detecting light from the grating mark, said detection optical system including a beam splitter disposed at or adjacent a pupil of said detection optical system and having a reflective coating partially formed thereon.

In one preferred form of this aspect of the present invention, the grating mark may comprise one of (i) a dot-like mark having periodicity in two directions and (ii) two marks having periodicity in different directions.

In one preferred form of this aspect of the present invention, said reflective coating of said beam splitter may have a function for selectively reflecting one component of reflectively diffractive light from the grating mark and for selectively transmitting the other component of the reflectively diffractive light from the grating mark.

In one preferred form of this aspect of the present invention, said detection optical system may further include means for correcting aberration of reflectively diffractive light of a predetermined order, with respect to light reflected by or transmitted through said beam splitter.

In one preferred form of this aspect of the present invention, said detection optical system may further include a stopper for transmitting reflectively diffractive light of said predetermined order.

In one preferred form of this aspect of the present invention, said detection optical system may further include means for applying an integration effect, with respect to a non-measurement direction of the grating mark, to light transmitted through said beam splitter.

In one preferred form of this aspect of the present invention, said detection optical system may provide the integration effect with use of a cylindrical lens, and said detection optical system may further include a one-dimensional sensor for detecting light passed through the cylindrical lens.

In one preferred form of this aspect of the present invention, said detection optical system may further include a reference mark projecting optical system disposed between the substrate and said beam splitter, for providing a reference for detection by said detection optical system.

In accordance with a still further aspect of the present invention, there is provided a method of performing position detection with use of a grating mark provided on a substrate and having different directionalities, and for projecting and printing a circuit pattern of an original onto the substrate, said method comprising the steps of: projecting light to the grating mark; and detecting light from the grating mark through a beam splitter disposed at or adjacent a pupil of a detection optical system, for receiving light from the grating mark, the beam splitter having a reflective coating partially formed thereon.

In one preferred form of this aspect of the present invention, the grating mark may comprise one of (i) a dot-like mark having periodicity in two directions and (ii) two marks having periodicity in different directions.

In one preferred form of this aspect of the present invention, the reflective coating of the beam splitter may have a function for selectively reflecting one component of reflectively diffractive light from the grating mark and for selectively transmitting the other component of the reflectively diffractive light from the grating mark.

In one preferred form of this aspect of the present invention, the detection optical system may have a function for correcting aberration of reflectively diffractive light of a predetermined order, with respect to light reflected by or transmitted through the beam splitter.

In one preferred form of this aspect of the present invention, detection optical system may include a stopper for transmitting reflectively diffractive light of said predetermined order.

In one preferred form of this aspect of the present invention, the detection optical system may have a function for applying an integration effect, with respect to a non-measurement direction of the grating mark, to light transmitted through the beam splitter.

In one preferred form of this aspect of the present invention, the detection optical system may provide the integration effect with use of a cylindrical lens, and the detection optical system may have a function for detecting light passed through the cylindrical lens by use of a one-dimensional sensor.

In one preferred form of this aspect of the present invention, detection optical system may further include a reference mark projecting optical system disposed between the substrate and the beam splitter, for providing a reference for detection by the detection optical system.

In accordance with a still further aspect of the present invention, there is provided a method of projecting and printing a circuit pattern of an original onto a substrate, comprising the steps of: taking an interference image of a dot-like mark provided on the substrate and having periodicity in two directions; and detecting the position of the substrate on the basis of the image taking.

In one preferred form of this aspect of the present invention, in said image taking step, interference images having directionalities in two directions, respectively, may be produced from the mark.

In one preferred form of this aspect of the present invention, the interference images having directionalities in two directions may be taken by use of different elements, for detection of the position.

In accordance with a still further aspect of the present invention, there is provided a method of projecting and printing a circuit pattern of an original onto a substrate, comprising the steps of: taking an interference image of a dot-like mark having periodicity in two directions and being provided on a detection optical system for receiving light from a mark on the substrate, the interference image being taken as a detection reference for the detection optical system; and detecting the position of the substrate on the basis of the detection reference.

In one preferred form of this aspect of the present invention, in said image taking step, interference images having directionalities in two directions, respectively, may be produced from the mark of the detection optical system.

In one preferred form of this aspect of the present invention, in said image taking step, interference images having directionalities in two directions, respectively, and produced from the mark of the detection optical system, may be taken by use of different elements, for position detection.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 6A:
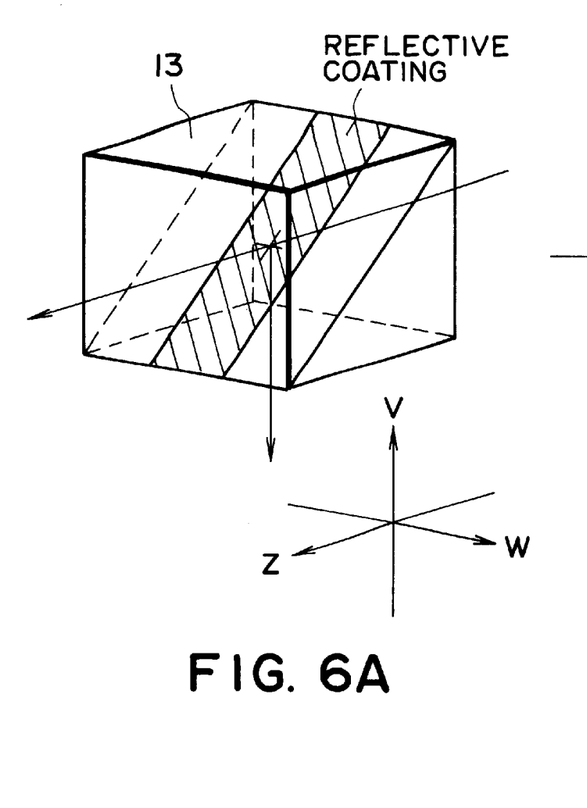
FIGS. 6A and 6B are schematic views, respectively, for explaining a pupil plane X-Y separation beam splitter according to an embodiment of the present invention.
Figure 6B:
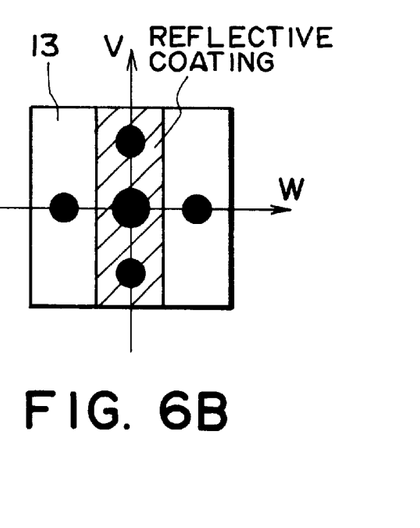

One preferred form of the present invention, for accomplishing higher resolution with a simple optical arrangement, utilizes the phenomenon that the position, upon a pupil plane of an alignment detection optical system, of reflectively diffractive light of (±n)-th order (n=1, 2, 3, . . . ) from grating marks for X measurement and Y measurement, having a periodicity and being provided on a wafer, differs between the X and Y measurement marks, such as depicted at (A) and (C) of FIG. 2, to assure separation of X and Y detection lights. To this end, in an embodiment of the present invention, a beam splitter such as shown in FIGS. 6A and 6B is provided at or adjacent the pupil plane of a detection optical system, the beam splitter having a reflective coating formed partially thereon for reflecting one of X and Y measurement diffractive lights and for transmitting the other. This assures separation of (±n)-th order diffractive lights from X and Y measurement grating marks.

Figure 7:
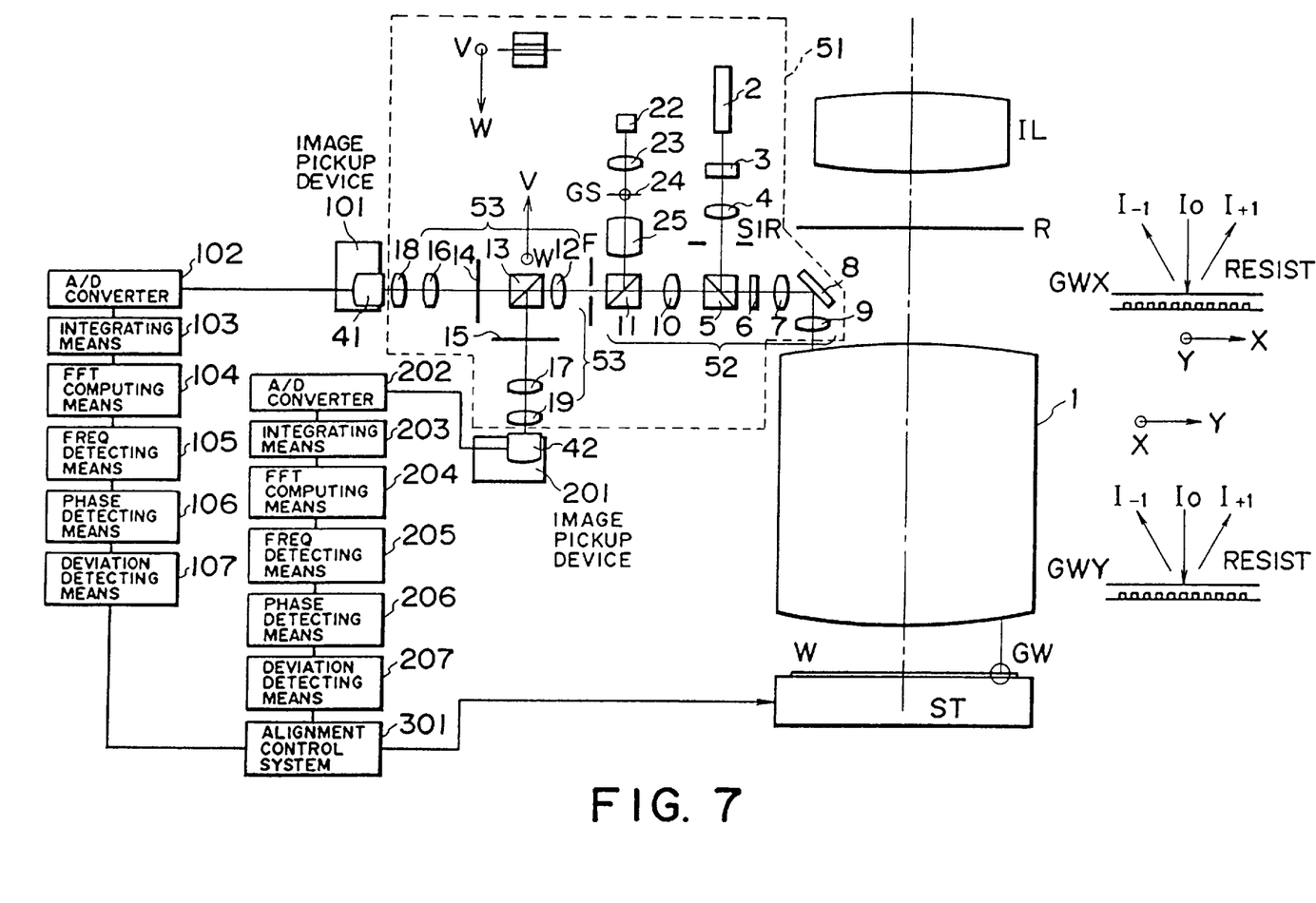
FIG. 7 is a schematic view of a main portion of a projection exposure apparatus according to an embodiment of the present invention.

FIG. 7 shows a projection exposure apparatus according to an embodiment of the present invention. Those components having similar function as corresponding elements of conventional examples described above, are denoted by like numerals. In FIG. 7, the pattern transfer process is performed by projecting, through a projection lens 1, an electronic circuit pattern formed on a reticle R surface as illuminated with exposure light from an illumination device IL, onto a wafer W surface placed on a wafer stage ST, in a reduced scale.

The alignment detecting system of this projection exposure apparatus comprises a detection optical system 51 having a reference mark GS, image pickup devices 101 and 201 having line sensors 41 and 42, a 10 wafer mark GW which is a grating mark formed on the wafer surface, and a signal processing system having elements 102–107 and 202–207. The output result of the alignment detecting system is supplied to an alignment controller 301. The mark GW may be called an "alignment mark".

In this embodiment, the relative position of the reticle R with respect to the projection exposure apparatus, that is, to the projection lens 1, the detection optical system 51 and the image pickup devices 101 and 201, is detected beforehand by using an appropriate detecting system. On the other hand, the relative position of the wafer can be detected by detecting positions, upon the image pickup surfaces of the image pickup devices 101 and 201, of the reference mark GS of the detecting system 51 and the wafer mark GW of the wafer W. Thus, the reticle R and the wafer W can be aligned with each other indirectly.

Now, the manner of detecting the position of the wafer mark GW on the wafer W with respect to X and Y directions, and of aligning the wafer W with respect to a predetermined position, will be described.

Light of alignment wavelength $\lambda$ different from the wavelength of exposure light and emitted from HeNe laser 2 (rectilinearly polarized light) enters an acoustooptic element (AO element) 3 by which the quantity of light to be directed to a lens 4 is controlled. With the light quantity control by acoustooptic element, in a certain state the light can be completely blocked.

Light passing through the acoustooptic element 3 is collected by the lens 4. Then, the light is projected on a polarization beam splitter 5 while the range of illumination is spatially restricted by a field stop SIR which is disposed on a plane optically conjugate with the wafer W. The polarization beam splitter 5 reflects the received light, and the light goes via a quarter wave plate 6, a lens 7, a mirror 8, a lens 9 and the projection lens 1. Then, the light illuminates the wafer mark GW on the wafer W surface in a direction perpendicular thereto.

Here, upon the pupil plane 31 of the optical system provided by the projection lens 1 and the lenses 9 and 10, the illumination light passes the location 10 shown in (A) and (C) of FIG. 2. Characters V and W, that is, (v, w), in the drawing denotes coordinates on the pupil plane. Distribution of incidence angle, upon the pupil plane, of the illumination light with respect to the wafer W surface is depicted by painted portions 10. Since the pupil plane 31 corresponds to Fourier transformation plane of the wafer W surface, the illumination light impinges on the wafer W perpendicularly.

More specifically, the wafer mark GW formed on the wafer W comprises a wafer mark GWX for X-axis measurement and a wafer mark GWY for Y-axis measurement. Each of these marks is provided by a diffraction grating pattern (grating mark) having a pitch P, such as shown at (B) or (D) of FIG. 2 wherein those regions depicted with hatching differs from the remaining regions in respect to level (height) or phase. This difference does provide the function as a diffraction grating.

Light reflected by the wafer mark GW passes through the projection lens 1 and, after this, it goes via the lens 9, mirror 8, lens 7, quarter waveplate 6 and polarization beam splitter 5 in this order. Then, it goes through a lens 10 and a beam splitter 11, and an aerial image of the wafer mark GW is formed at position F. The aerial image produced at the position F further goes through a Fourier transformation lens 12, whereby it is Fourier transformed. The thus Fourier transformed position is the pupil position of the detection optical system, and upon the pupil plane there are formed distributions of reflectively diffractive lights corresponding to the wafer marks GWX and GWY, such as depicted at (A) and (C) of FIG. 2. Upon the pupil plane, the grating mark GWX which is in an array along the X direction for X-axis measurement on the wafer W and the grating mark GWY which is in an array along the Y direction for Y-axis measurement have a relation that reflectively diffractive lights are produced therefrom in directions perpendicular to each other.

In this embodiment, a beam splitter 13 is disposed at or adjacent the pupil plane, wherein the beam splitter 13 is provided with a partial coating for reflecting only reflectively diffractive light from the grating mark GWX in an array along the X direction, such as shown in FIG. 6B.

By the function of this beam splitter 13, the flux of reflectively diffractive light produced by the grating mark GWX in an array along X direction and the flux of reflectively diffractive light produced by the grating mark GWY in an array along Y direction, can be separated from each other. As a matter of course, reflection may be provided with respect to Y direction, not X direction. By using a beam splitter having a partial reflection region such as described above, diffractive lights in two directions can be separated from each other, such as one direction for reflection and the other direction for transmission.

After X and Y separation, along respective light paths there are stoppers 14 and 15 each being disposed at the pupil plane, for selectively extracting reflective diffractive light of predetermined order. For example, if reflectively diffractive light of first order is to be transmitted, what should be selected is reflectively diffractive light corresponding to $\pm\sin^{-1}(\lambda/P)$. The light selected by the stopper 14 or 15 passes through a Fourier transformation lens 16 or 17. Then, through a cylindrical optical system 18 or 19 which serves to provide integration with respect to non-measurement direction, an interference image of the wafer mark GWX (GWY) is produced upon a line sensor 41 (42) which is image pickup means.

By using, as an image pickup device, the line sensor 41 or 42 having a wide image pickup range only in one direction, image pickup function with high magnification and high resolution, being restricted in one direction, can be accomplished as compared with a case where two-dimensional image pickup device is used. A decrease in light quantity due to enlarged magnification can be prevented by optically integrating the light in the non-measurement direction (widthwise direction of the line sensor 41 or 42) with use of the cylindrical optical system 18 or 19.

Figure 3B:
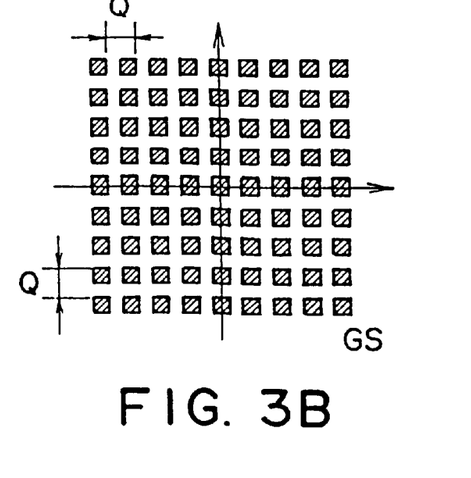

On the other hand, a light source 22 such as LED, for example, produces a wavelength different from the alignment illumination wavelength for the wafer mark GW, and the light from the light source 22 is collected by a condenser lens 23 to illuminate a reference mark GS which is formed on the surface of a reference mask 24. This portion corresponds to a projecting optical system for the reference mark GS. The reference mark GS provides a reference for detection through the detection optical system 51. In order to define a reference with respect to both X and Y directions, it comprises a grating mark (or dot-like mark) having periodicity in two directions (X and Y directions) (FIG. 3B), such that it can produce diffractive lights in X and Y directions. In FIG. 3B, those portions as depicted with hatching correspond to transparent regions, while the remaining portions correspond to non-transparent regions.

Light passed through the reference mark GS is collected by a lens 25 and, after this, it goes via the beam splitter 11 for reflecting light from the LED 22 and for transmitting light from the HeNe laser 2, whereby an aerial image of the reference mark GS is produced upon the plane F.

Similarly to the wafer mark GW, the aerial image of the reference mark GS on the plane F is imaged upon the line sensors 41 and 42 by means of the Fourier transformation lenses 12, 16 and 17 as well as the cylindrical optical systems 18 and 19. Here, the optical system 53 as provided by the Fourier transformation lenses 12, 16 and 17 is satisfactorily aberration corrected with respect to two wavelengths for illuminating the reference mark GS and the wafer mark GW.

An interference image as detected by the image pickup device 101 (201) is processed by an analog-to-digital (A/D) converter 102 (202) and an integration device 103 (203) and, after this, it is signal processed by an FFT calculation device 104 (204). The thus processed signal is then processed by a frequency intensity detecting device 105 (205) and a phase detecting device 106 (206) and, after that, it is converted into a deviation amount by means of a deviation detecting device 107 (207). The thus determined deviation is applied to an alignment controller 301, such that alignment control through the whole exposure apparatus is performed.

A second embodiment of the present invention uses a structure of a system for measuring a wafer alignment mark provided by a grating mark such as shown in FIG. 3B which comprises periodic dots and produces diffractive light in X and Y directions, for measurement in these directions. The detection system of FIG. 7 can automatically separate X information and Y information by use of the beam splitter 13 and on the basis of the directionality of diffractive light. With this structure, therefore, two-direction measurement in X and Y can be done simultaneously by use of the mark shown in FIG. 3B. Also in this embodiment, since the detecting system of FIG. 7 can be used as the detection system, disposition of reference mark as well as correction of chromatic aberration may be essentially the same as those of the first embodiment.

For detection of a mark of periodic dots, conventionally, two-dimensional image pickup device (it requires long measurement time) or a combination of one-dimensional sensor with switching of X and Y measurements has been used. As compared therewith, this embodiment enables detection with one-dimensional line sensor means without any switching mechanism. Therefore, there is no heat generation of switching actuator or no vibration thereby. Thus, measurement can be made with high resolution and high precision, constantly.

As described above, the present invention utilizes a difference in directionality of light quantity distribution upon a Fourier transformation plane between periodic grating marks for X and Y measurements, provided on the surface of a wafer. With a very simple arrangement in which a beam splitter having a partial reflection coating is disposed at or adjacent the pupil plane of an alignment optical system, measurement in X and Y directions can be accomplished through use of a single detection optical system. When an ordinary half mirror is conventionally used to perform X and Y direction detection with use of a single detection optical system, there is a problem of loss of light quantity due to division of light. In accordance with the present invention, as compared therewith, since spatial separation characteristic of diffractive lights of ($\pm$n)-th order (n=1, 2, 3, ...) of X and Y alignment marks upon the pupil plane is used, one of diffractive lights in two directions can be reflected while the other can be transmitted, without such a loss.

Since the present invention does not need use of a X and Y measurement switching mechanism, there occurs no heat generation or vibration of switching actuator. Thus, measurement can be made at high precision and stably. Further, since X and Y measurements are not separated by switching, use of a dot-like grating mark, as a mark on the wafer, which produces diffractive lights in X and Y directions effectively assures simultaneous measurement in X and Y directions.

While the invention has been described with reference to the structures disclosed herein, it is not confined to the details set forth and this application is intended to cover such modifications or changes as may come within the purposes of the improvements or the scope of the following claims.

What is claimed is:

1. A position detecting system to be used with a grating mark provided on an object and having different directionalities, comprising:

means for projecting light to the grating mark; and a detection optical system for detecting light from the grating mark, said detection optical system including a beam splitter disposed at or adjacent a pupil of said detection optical system and having a reflective coating partially formed thereon.

2. A position detecting system according to claim 1, wherein the grating mark comprises one of (i) a dot-like mark having periodicity in two directions and (ii) two marks having periodicity in different directions.

3. A position detecting system according to claim 1, wherein said reflective coating of said beam splitter has a function for selectively reflecting one component of reflectively diffractive light from the grating mark and for selectively transmitting the other component of the reflectively diffractive light from the grating mark.

4. A position detecting system according to claim 3, wherein said detection optical system further includes means for correcting aberration of reflectively diffractive light of a predetermined order, with respect to light reflected by or transmitted through said beam splitter.

5. A position detecting system according to claim 4, wherein said detection optical system further includes a stopper for transmitting reflectively diffractive light of said predetermined order.

6. A position detecting system according to claim 3, wherein said detection optical system further includes means for applying an integration effect, with respect to a non-measurement direction of the grating mark, to light transmitted through said beam splitter.

7. A position detecting system according to claim 6, wherein said detection optical system provides the integration effect with use of a cylindrical lens, and wherein said detection optical system further includes a one-dimensional sensor for detecting light passed through the cylindrical lens.

8. A position detecting system according to claim 3, wherein said detection optical system further includes a reference mark projecting optical system disposed between the object and said beam splitter, for providing a reference for detection by said detection optical system.

9. A position detecting system according to claim 4, wherein said detection optical system further includes a reference mark projecting optical system disposed between the object and said beam splitter, for providing a reference for detection by said detection optical system.

10. A position detecting system according to claim 5, wherein said detection optical system further includes a reference mark projecting optical system disposed between the object and said beam splitter, for providing a reference for detection by said detection optical system.

11. A position detecting system according to claim 6, wherein said detection optical system further includes a reference mark projecting optical system disposed between the object and said beam splitter, for providing a reference for detection by said detection optical system.

12. A position detecting system according to claim 7, wherein said detection optical system further includes a reference mark projecting optical system disposed between the object and said beam splitter, for providing a reference for detection by said detection optical system.

13. A position detecting method to be used with a grating mark provided on an object and having different directionalities, comprising the steps of:
    projecting light to the grating mark; and
    detecting light from the grating mark through a beam splitter disposed at or adjacent a pupil of a detection optical system, for receiving light from the grating mark, the beam splitter having a reflective coating partially formed thereon.

14. A method according to claim 13, wherein the grating mark comprises one of (i) a dot-like mark having periodicity in two directions and (ii) two marks having periodicity in different directions.

15. A method according to claim 13, wherein the reflective coating of the beam splitter has a function for selectively reflecting one component of reflectively diffractive light from the grating mark and for selectively transmitting the other component of the reflectively diffractive light from the grating mark.

16. A method according to claim 15, wherein the detection optical system has a function for correcting aberration of reflectively diffractive light of a predetermined order, with respect to light reflected by or transmitted through the beam splitter.

17. A method according to claim 16, wherein the detection optical system includes a stopper for transmitting reflectively diffractive light of said predetermined order.

18. A method according to claim 15, wherein the detection optical system has a function for applying an integration effect, with respect to a non-measurement direction of the grating mark, to light transmitted through the beam splitter.

19. A method according to claim 18, wherein the detection optical system provides the integration effect with use of a cylindrical lens, and wherein the detection optical system has a function for detecting light passed through the cylindrical lens by use of a one-dimensional sensor.

20. A method according to claim 15, wherein the detection optical system further includes a reference mark projecting optical system disposed between the object and the beam splitter, for providing a reference for detection by the detection optical system.

21. A method according to claim 16, wherein the detection optical system further includes a reference mark projecting optical system disposed between the object and the beam splitter, for providing a reference for detection by the detection optical system.

22. A method according to claim 17, wherein the detection optical system further includes a reference mark projecting optical system disposed between the object and the beam splitter, for providing a reference for detection by the detection optical system.

23. A method according to claim 18, wherein the detection optical system further includes a reference mark projecting optical system disposed between the object and the beam splitter, for providing a reference for detection by the detection optical system.

24. A method according to claim 19, wherein the detection optical system further includes a reference mark projecting optical system disposed between the object and the beam splitter, for providing a reference for detection by the detection optical system.

25. A method of detecting a position of an object, comprising the steps of:
    taking an interference image of a dot-like mark provided on the object and having periodicity in two directions; and
    detecting the position of the object on the basis of the image taking.

26. A method according to claim 25, wherein, in said image taking step, interference images having directionalities in two directions, respectively, are produced from the mark.

27. A method according to claim 26, wherein the interference images having directionalities in two directions are taken by use of different elements, for detection of the position.

28. A method of detecting a position of an object, comprising the steps of:
    taking an interference image of a dot-like mark having periodicity in two directions and being provided on a detection optical system for receiving light from a mark on the object, the interference image being taken as a detection reference for the detection optical system; and
    detecting the position of the object on the basis of the detection reference.

29. A method according to claim 28, wherein, in said image taking step, interference images having directionalities in two directions, respectively, are produced from the mark of the detection optical system.

30. A method according to claim 29, wherein, in said image taking step, interference images having directionalities in two directions, respectively, and produced from the mark of the detection optical system, are taken by use of different elements, for position detection.

31. A projection exposure apparatus for performing position detection with use of a grating mark provided on a substrate and having different directionalities, and for projecting and printing a circuit pattern of an original onto the substrate, said apparatus comprising:

means for projecting light to the grating mark; and a detection optical system for detecting light from the grating mark, said detection optical system including a beam splitter disposed at or adjacent a pupil of said detection optical system and having a reflective coating partially formed thereon.

32. An apparatus according to claim 31, wherein the grating mark comprises one of (i) a dot-like mark having periodicity in two directions and (ii) two marks having periodicity in different directions.

33. An apparatus according to claim 31, wherein said reflective coating of said beam splitter has a function for selectively reflecting one component of reflectively diffractive light from the grating mark and for selectively transmitting the other component of the reflectively diffractive light from the grating mark.

34. An apparatus according to claim 33, wherein said detection optical system further includes means for correcting aberration of reflectively diffractive light of a predetermined order, with respect to light reflected by or transmitted through said beam splitter.

35. An apparatus according to claim 34, wherein said detection optical system further includes a stopper for transmitting reflectively diffractive light of said predetermined order.

36. An apparatus according to claim 33, wherein said detection optical system further includes means for applying an integration effect, with respect to a non-measurement direction of the grating mark, to light transmitted through said beam splitter.

37. An apparatus according to claim 36, wherein said detection optical system provides the integration effect with use of a cylindrical lens, and wherein said detection optical system further includes a one-dimensional sensor for detecting light passed through the cylindrical lens.

38. An apparatus according to claim 33, wherein said detection optical system further includes a reference mark projecting optical system disposed between the substrate and said beam splitter, for providing a reference for detection by said detection optical system.

39. An apparatus according to claim 34, wherein said detection optical system further includes a reference mark projecting optical system disposed between the substrate and said beam splitter, for providing a reference for detection by said detection optical system.

40. An apparatus according to claim 35, wherein said detection optical system further includes a reference mark projecting optical system disposed between the substrate and said beam splitter, for providing a reference for detection by said detection optical system.

41. An apparatus according to claim 36, wherein said detection optical system further includes a reference mark projecting optical system disposed between the substrate and said beam splitter, for providing a reference for detection by said detection optical system.

42. An apparatus according to claim 37, wherein said detection optical system further includes a reference mark projecting optical system disposed between the substrate and said beam splitter, for providing a reference for detection by said detection optical system.

43. A method of performing position detection with use of a grating mark provided on a substrate and having different directionalities, and for projecting and printing a circuit pattern of an original onto the substrate, said method comprising the steps of:

projecting light to the grating mark; and detecting light from the grating mark through a beam splitter disposed at or adjacent a pupil of a detection optical system, for receiving light from the grating mark, the beam splitter having a reflective coating partially formed thereon.

44. A method according to claim 43, wherein the grating mark comprises one of (i) a dot-like mark having periodicity in two directions and (ii) two marks having periodicity in different directions.

45. A method according to claim 43, wherein the reflective coating of the beam splitter has a function for selectively reflecting one component of reflectively diffractive light from the grating mark and for selectively transmitting the other component of the reflectively diffractive light from the grating mark.

46. A method according to claim 45, wherein the detection optical system has a function for correcting aberration of reflectively diffractive light of a predetermined order, with respect to light reflected by or transmitted through the beam splitter.

47. A method according to claim 46, wherein the detection optical system includes a stopper for transmitting reflectively diffractive light of said predetermined order.

48. A method according to claim 45, wherein the detection optical system has a function for applying an integration effect, with respect to a non-measurement direction of the grating mark, to light transmitted through the beam splitter.

49. A method according to claim 48, wherein the detection optical system provides the integration effect with use of a cylindrical lens, and wherein the detection optical system has a function for detecting light passed through the cylindrical lens by use of a one-dimensional sensor.

50. A method according to claim 45, wherein the detection optical system further includes a reference mark projecting optical system disposed between the substrate and the beam splitter, for providing a reference for detection by the detection optical system.

51. A method according to claim 46, wherein the detection optical system further includes a reference mark projecting optical system disposed between the substrate and the beam splitter, for providing a reference for detection by the detection optical system.

52. A method according to claim 47, wherein the detection optical system further includes a reference mark projecting optical system disposed between the substrate and the beam splitter, for providing a reference for detection by the detection optical system.

53. A method according to claim 48, wherein the detection optical system further includes a reference mark projecting optical system disposed between the substrate and the beam splitter, for providing a reference for detection by the detection optical system.

54. A method according to claim 49, wherein the detection optical system further includes a reference mark projecting optical system disposed between the substrate and the beam splitter, for providing a reference for detection by the detection optical system.

* * * * *

UNITED STATES PATENT AND TRADEMARK OFFICE
CERTIFICATE OF CORRECTION

PATENT NO.    : 6,313,916 B1
DATED         : November 6, 2001
INVENTOR(S)   : Hiroshi Inada It is certified that error appears in the above-identified patent and that said Letters Patent is hereby corrected as shown below:

<u>Title page,</u>
Item [56], References Cited, under "Foreign Patent Documents,"
"5-343291  12/1993  (JP)." should be deleted.

Signed and Sealed this

Sixteenth Day of July, 2002

Attest:

Attesting Officer

JAMES E. ROGAN
Director of the United States Patent and Trademark Office